United States Patent [19]
Metzger et al.

[11] Patent Number: 5,369,358
[45] Date of Patent: Nov. 29, 1994

[54] METHOD OF ENSURING ELECTRICAL CONTACT BETWEEN TEST PROBES AND CHIP PADS THROUGH THE USE OF VIBRATION AND NONDESTRUCTIVE DEFORMATION

[75] Inventors: Roland Metzger, Wimsheim; Manfred Schmidt, Schoenaich; Otto Torreiter, Leinfelden-Echterdingen; Dieter Wendel, Sindelfingen, all of Germany

[73] Assignee: International Business Machines Corporation, Armonk, N.Y.

[21] Appl. No.: 965,472

[22] Filed: Oct. 23, 1992

[30] Foreign Application Priority Data

Dec. 14, 1991 [EP] European Pat. Off. ........ 91121467.4

[51] Int. Cl.$^5$ ............................................. G01R 1/04
[52] U.S. Cl. .................................... 324/754; 324/758
[58] Field of Search .................... 324/158 P, 158 F

[56] References Cited

U.S. PATENT DOCUMENTS

| | | | |
|---|---|---|---|
| 3,644,829 | 2/1972 | Chan et al. | 324/158 P |
| 3,996,517 | 12/1976 | Fergason et al. | 324/158 P |
| 4,673,839 | 7/1987 | Veenendaal | 310/338 |
| 4,780,836 | 10/1988 | Miyazaki et al. | 364/551.01 |
| 4,864,227 | 9/1989 | Sato | 324/158 F |
| 4,906,920 | 3/1990 | Huff et al. | 324/158 F |
| 5,128,612 | 7/1992 | Aton et al. | 324/158 P |

FOREIGN PATENT DOCUMENTS 2094479 9/1982 United Kingdom .

OTHER PUBLICATIONS

W. R. Smith, "Closed-Loop Control of the Z Stage of a Wafer Prober", IBM Technical Disclosure Bulletin, vol. 26, No. 7B, Dec. 1983, p. 3579.
Takeuchi Takashi, "Wafer Prober", Patent Abstracts of Japan, vol. 011306, Jun. 10, 1987, p. 1.

*Primary Examiner*—Kenneth A. Wieder
*Assistant Examiner*—Barry C. Bowser
*Attorney, Agent, or Firm*—H. Daniel Schnurmann

[57] ABSTRACT

A method of testing chips having each a plurality of contact pads, the chips are arranged on a semiconductor wafer or on a printed circuit and are tested with a test system having a test head provided with a plurality of probes, the method comprising the steps of: a) moving the test head and the chips towards each other by a distance which is smaller than a predefined maximum length; b) determining the presence of a contact between the probes and the contact pads by performing an electrical test via the probes to yield a predetermined electrical result; and c) repeating steps a) and b) until the electrical test no longer yields the predetermined electrical result or until the predefined maximum length is reached. The invention also provides for a test system for carrying out the inventive method.

13 Claims, 3 Drawing Sheets

METHOD OF ENSURING ELECTRICAL CONTACT BETWEEN TEST PROBES AND CHIP PADS THROUGH THE USE OF VIBRATION AND NONDESTRUCTIVE DEFORMATION

FIELD OF THE INVENTION

The invention relates to a method of testing a semiconductor chip and to a test system having a test head provided with a plurality of probes for contacting pads, wherein the pads are placed on chips arranged on a wafer or printed card.

BACKGROUND OF THE INVENTION

In general, micro circuits such as integrated circuits are fabricated from thin semiconductor slices—called wafers—having a plurality of micro circuits or chips, thereon. Customarily, each wafer contains a plurality of identical repeating matrices of the same type of micro circuit. Before final processing and encapsulation, it is customary to test each chip prior to separating by dicing the wafer into desired individual chips. Since each chip is normally positioned in a predetermined precise relation with respect to adjacent circuit units, it is possible to automatically test each individual chip separately. A plurality of probes have to be accurately located on each preselected contact pad of the chip to be tested on the wafer. Normally, testing is performed by applying signals at input terminals of the chip and measuring the values at the output terminals of the chip via the probes.

Several obstacles must be overcome in this test procedure in order to have reliable testing. Since the relative height of the contact pads of a chip on a wafer can vary substantially from one pad to the next, testing probes having electrodes with mechanically flexible characteristics have been employed in the prior art in order to properly contact the pads. Wherever the chip pads have a substantial dimensional tolerance in the relative height thereof with respect to the surface of the wafer, the resiliency of the probes being incorporated in a test head is to compensate for such variation. However, a problem arises when the resiliency of the probes may not be sufficient to compensate for the dimensional tolerance of the pads, since the probes themselves also have a tolerance in length relatively to the test head. In the case that a relatively short probe is to contact a relatively flat pad, an open may exist between the probe and the pad. Since it is not possible to distinguish a real open in the chip to be tested and a pseudo open between a probe and a pad, the result of the test procedure may be erroneous thereby resulting in an actually good chip being considered not operational. Obviously this results in a loss of yield. Test systems of this kind have been proposed, for example, in IBM Technical Disclosure Bulletin, Volume 22, No. 7, December 1979, pages 2824 to 2826, in IBM Technical Disclosure Bulletin, Volume 26, No. 1, June 1983, page 251, and in European Patents EP-B-0 130 350, EP-A-0 331 163, EP-A-0 256 541 and EP-A-0 343 021, wherein different resilient probe constructions are shown.

In order to improve the reliability of testing, flexible probes having a piezoelectric member have been described in U.S. Pat. No. 4,951,370. An electrical signal is produced by the piezoelectric member when sufficient force is imparted to the probe tip to cause corresponding flexing of the piezoelectric member. This signal serves to indicate whether mechanical contact of probe and pad has been achieved. This control signal is also used according to the teaching of this document for a technique called scrub-in. After the probe tips make contact with the pads, it is necessary for the waferholder to move an additional distance towards the probes in order to break through the oxide layer on the pads and make good electrical contact with the chip. However special piezoelectric probes have to be used according to the teaching of this document and no solution to the above described problem is provided, when a relatively short probe is to contact a relatively flat pad so that an open in the chip is indicated where in reality none exists.

SUMMARY OF THE INVENTION

In accordance with the present invention, it is disclosed a method of testing a chip having a plurality of contact pads, which is tested with a test system having a test head provided with a plurality of test probes, the method comprising the steps of: a) moving the test head and the chips towards each other by a distance which is smaller than a predefined maximum length; b) determining the presence of a contact between the probes and the contact pads by performing an electrical test via the probes to yield a predetermined electrical result, the result indicating the absence of electrical contact between at least one of the probes and a corresponding one of the contact pads; and c) repeating steps a) and b) while vibrating the test head or the contact pads in a plane that is substantially parallel to a plane comprising the contact pads until the electrical test no longer yields the predetermined electrical result, thereby indicating that electrical contact between all the test probes and their respective contact pad has been obtained.

More particularly, the invention provides for a test system to test chips, such as an integrated circuit on a wafer or on a printed circuit board.

The solution, in accordance with the present invention, takes advantage of the fact that ordinary contact pads, such as C4-balls, can be deformed relatively easily due to their material properties. Normally, no heating of the wafer is necessary in order to plastically deform the contact pads.

If an electrical test which is carried out on a chip shows a certain result, such as an "open" in the chip, this can be attributed to a real open in the circuit. However, this condition can also be caused by a pseudo-open between a probe of the test head and the corresponding pad. The electrical test of the chips can only be carried out correctly if all electrical contacts between the probes and the corresponding pads are properly made. In most instances, all contacts are correctly made if the test head is moved by a certain distance from its starting position towards the contact pads in order to press the probes against the contact pads, so that the oxide layer on the pads is broken through. There is, however, a statistical probability that a relatively short probe will not contact a flat pad having a relatively small vertical extension because of tolerances of the probes and the pads. In this case, all contacts are made with the exception of the above described probe-pad pair. Thus, the electrical test of the chip will result in an "open" condition. There is no possibility of determining in prior art test systems whether an "open" condition is a real open in the circuit or a pseudo-open. Consequently, in prior art test systems, an "open" is always interpreted as an open in the chip and consequently a good chip is automatically considered defective resulting in a decrease in yield.

The solution in accordance with the present invention overcomes this prior art drawback by deforming the contact pads which are already in mechanical contact with their corresponding probes. This is done by further moving the test head towards the contact pads or vice versa, depending on the mechanical construction of the test system which is used. By this further motion, an increased pressure is applied to the pads which have already been contacted. The pads are deformed so that the probe-pad pair, which has not yet made contact also comes into closer contact. If the electrical test is repeated and shows again the same "open" result, the operation is repeated a second time, deforming more and more the contact pads which already are in contact with the probes. If, after replicating this procedure several times and moving the test head or the probes, respectively, towards each other for a predefined maximum length, it still yields the same result, the chip is considered defective.

Preferably, before each repetition of the electrical test, the test head or the probes are made to move or vibrate relative to each other in a plane substantially parallel to a plane comprising the pads of the chip. This step is carried out so that a certain curve form is circumscribed by the test head or the pads, respectively. The curve form to be circumscribed can be, e.g., a straight line, a circle or an ellipse. Furthermore, the above described step of moving or vibrating is preferably carried out with a predefined amplitude being approximately half the pads' diameter. This applies shearing forces to the pads so that further plastical deformation of the pads takes place. Alternatively, the probes can be made to vibrate by an ultrasonic sound source in order to deform the pads. Preferably, the frequency of the ultrasonic sound source is chosen to correspond approximately to a resonant frequency of the probes.

Wafers incorporating chips normally display a surface warpage. The method, in accordance with the present invention, also provides for compensation of the detrimental effect of this surface warpage by the above described adaptive deformation of the pads. It is a further advantage of the invention, that a test system which is operated according to the teaching of the invention undergoes less mechanical stressing. This is due to the fact that, firstly, the test head or the pads are to move towards each other for a distance smaller than a predefined maximum length. The maximum length corresponding to a maximum pressure to be exerted on the probes and to the test head is only reached in rare cases. During the test procedure, the pads which are in mechanical contact with the corresponding pads are plastically deformed by each repetition of the test loop so that they eventually become flatter. Thus, the pressure exerted on the pads does not increase linearly as the test head and the contact pads come nearer to each other. Therefore, the maximum length can be longer or, alternatively, the minimum distance between the test head and the pads can be shorter without exceeding the maximum allowable pressure. This iterative procedure makes it possible to start with a smaller length corresponding to a relatively low pressure.

BRIEF DESCRIPTION OF THE DRAWINGS

The foregoing and other objects of the invention will become apparent from the following detailed specification which sets forth illustrative embodiments of the invention. The drawings form part of this specification wherein.

DETAILED DESCRIPTION OF THE INVENTION

Figure 1:
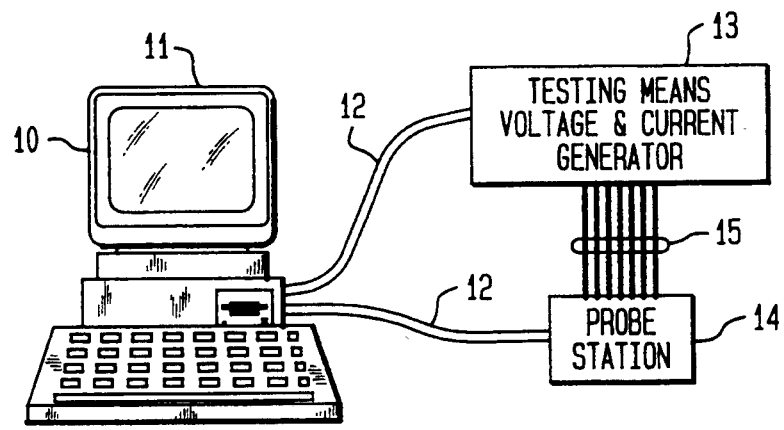
FIG. 1 is a diagram of the set-up of a test-system according to the invention.
Figure 2:
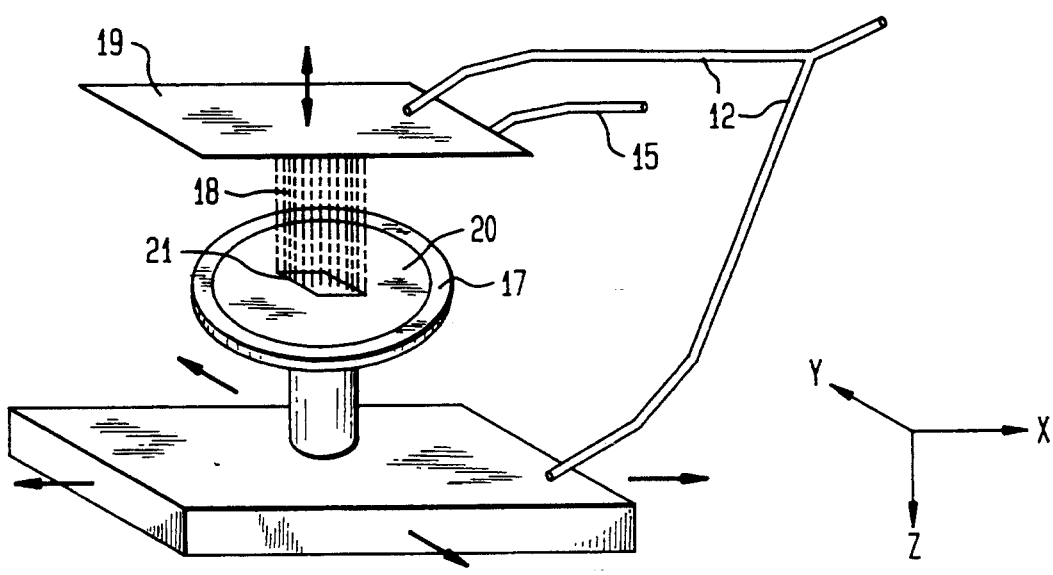
FIG. 2 is a perspective view schematically showing a construction of the probe station of the inventive test system.

Referring now to FIG. 1, there is shown a diagram of a test system 10. The test system includes a controller 11, typically a desk top computer, interfacing electrical bus 12, testing means 13 for generating and sensing voltage and measurement currents which are bussed to a probe station 14 through an electrical bus 15 and connected to the test head 19 shown in FIG. 2. The controller 11 controls the movement of a wafer holder 17 (FIG. 2) at the probe station 14 and the movement of the test head 19, which incorporates a matrix of probes 18 (FIG. 2). Furthermore, the controller 11 controls the testing means 13, so that appropriate currents or voltages are applied to selected probes 18 (FIG. 2). The response currents or voltages are measured with the testing means that includes an appropriate program or linked programs.

FIG. 2 shows a more detailed version of the probe station. The station is comprised of a wafer holder 17 and a test head 19 that includes a matrix of probes 18. The wafer holder 17 moves in the x-y plane, whereas the test head 19 moves along the z-direction by positioning means, preferably comprising stepper motors, which are not shown in the drawing. When the semiconductor wafer 20 is mounted on the wafer holder 17, the test-system utilizes the degrees of freedom provided to bring into alignment the probes 18 of the test head 19 and pads 22 on chip 21 fabricated on wafer 20.

Figure 3A:
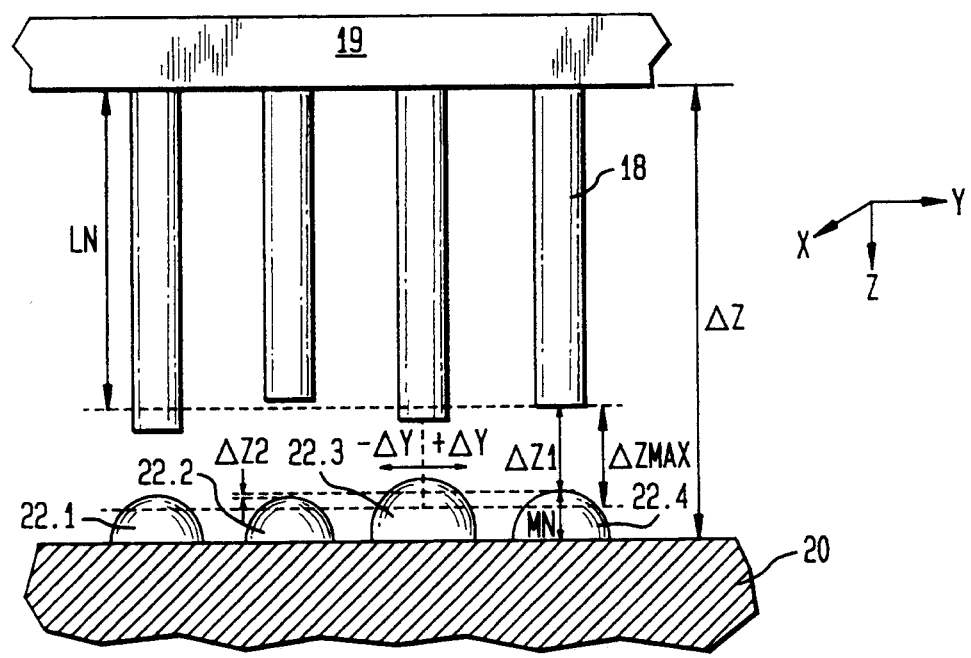
FIG. 3a, b, and c is a magnified schematic view of the probes and corresponding pads of a chip on a wafer to be tested, and further depicting the iterative deformation of certain pads.

Referring to FIG. 3a, it is shown a set of probes 18 which are to be brought into contact with pads 22. In this preferred embodiment of the invention, the probes 18, so-called "cobra probes", are commonly used in the art and described, e.g., in IBM Technical Disclosure Bulletin, Volume 26, No. 1, June 1983, page 251. The probe's diameter in this case is about 0.10 mm. In this particular embodiment, the pads 22 are realized as C4-balls having a diameter of about 0.150 mm. The technology of Controlled Collapse Chip Connection (C4) is widely used in the art and described, e.g., in "Microelectronics Packaging Handbook" by Tummala and Rymaszewski, Van Nostrand Reinhold, New York, 1989, chapter 6.3, pages 366 to 391. The C4-balls 22 shown belong to chip 21 which is fabricated on wafer 20. The number of C4-balls 22 belonging to one chip is currently in the order of several hundreds, typically, 300 to 600 and this number is likely to increase with the advance of chip technology. It is also shown in FIG. 3a that the length of the probes and the magnitude of the pads have a certain degree of tolerance and, thus, generally do not exactly have the required nominal length $l_n$ and magnitude $M_n$, respectively.

Figure 3B:
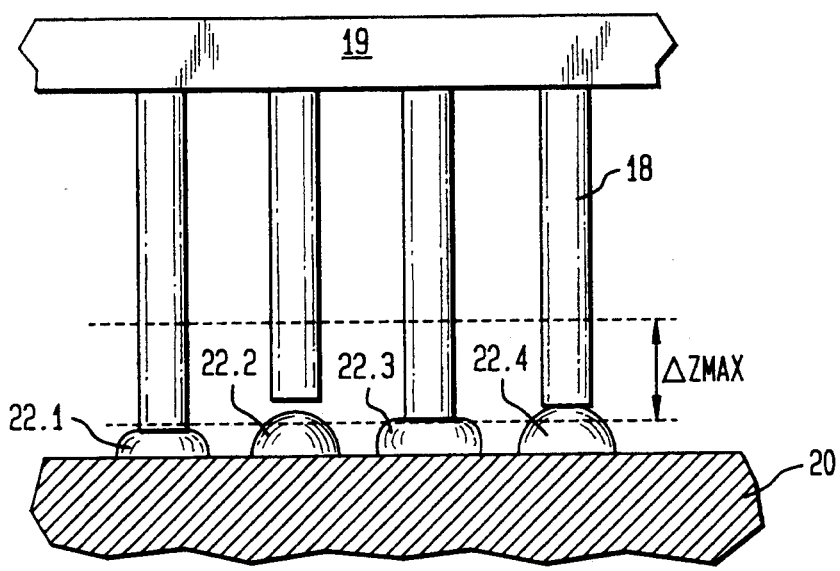
Figure 3C:
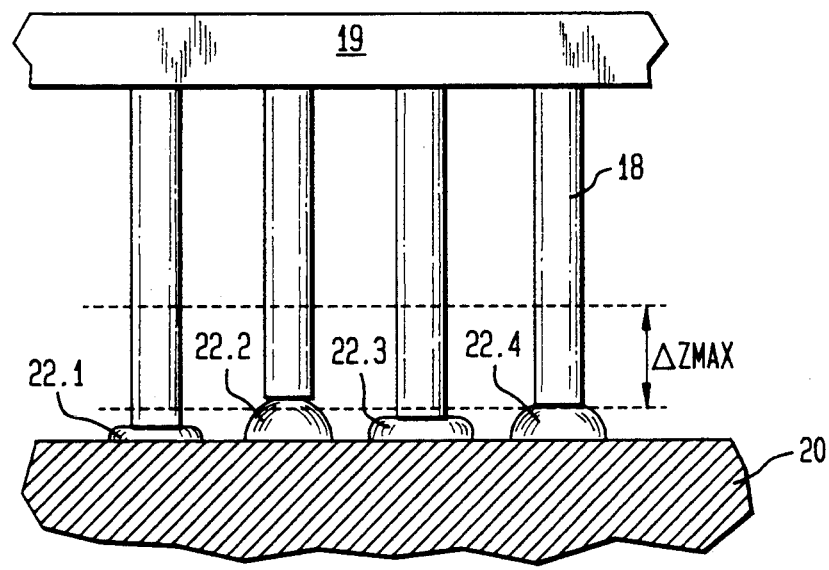
Figure 4:
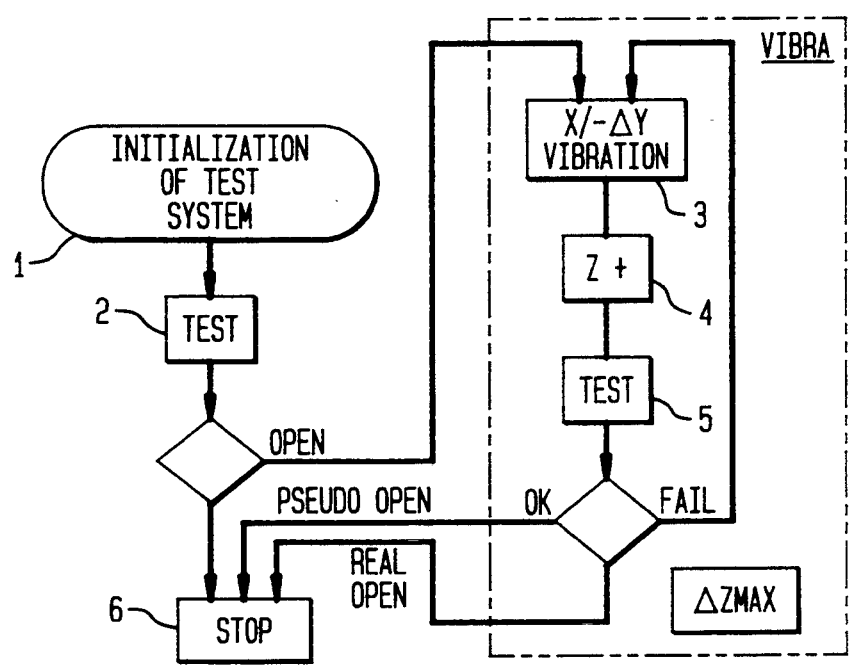
FIG. 4 is a flow-chart showing a preferred embodiment of the present invention.

With reference to FIG. 4, a preferred embodiment of the method of the present invention is described in greater detail. In step 1—initialization of the test-system—the test head is moved from its starting position, at a distance $\Delta z$ above the wafer holder 17, as shown in FIG. 3, to a first distance $\Delta z1$ towards the contact pads 22. The first distance $\Delta z1$ is smaller than a predefined maximum length $\Delta z_{max}$ which, in any event, is not to be exceeded to prevent damage to the system.

In step 2, an electrical test of the chip 21 is performed by testing means 13 via the probes. Since there are still opens between several probes 18 and the corresponding pads 22 after performing step 1 because of tolerances (cf. FIG. 3a, pad 22.2), the test shows the result "open". This initializes the subroutine VIBRA comprising steps 3, 4 and 5. In step 3, the controller 11 controls the stepper motors of wafer holder 17 so that the pads on the wafer are moved once or several times back and forth by a length $-\Delta yy$ and $+\Delta y$ in the y-direction in order to plastically deform the pads (22.1, 22.3) which are already mechanically pressed against the probes. The result of this deformation is schematically shown in FIG. 3b.

In step 4, the controller 11 controls the stepper motor of the test head to move the test head an additional smaller distance z2 towards the pads 22. In step 5, the electrical test is performed anew. Steps 3, 4 and 5 are repeated as long as step 5 shows the same result, (i.e. "open"), thereby bringing the test head 19 closer and closer to the pads. Preferably, $\Delta z2$ is decremented by a smaller value after each iteration. If, after several attempts, all probe-pad contacts are properly made and the chip 21 is determined to be good, step 5 will show the result "OK". It is clear that the initial open detected in step 2 is not a real one for chip 21, except for a pseudo-open between at least one probe 18 and one pad 22. The final result of the above described iterative deformation is shown in FIG. 3c.

If after several iterations of steps 3, 4 and 5, the maximum length $\Delta z_{max}$ is reached and the test of step 5 still yields the same result (i.e. "open"), the open is considered to be in the chip and not caused by a bad contact between a probe and the pad.

In case where all contacts are properly made in step 1 and the test shows the result "OK" or "good chip", testing of chip 22 at this stage of chip production is terminated and the system can proceed to a second chip 22 adjacent the first chip on the same wafer 17, starting with step 1 anew.

Practioners of the art will readily appreciate that significant deformation of some of the contact pads 22 will occur (cf. pads 22.1 and 22.3 in FIG. 3b) as a result of the repetition of steps 3 and 4 resulting in compensation of the tolerances of the magnitude of the pads 22 and probes 18. This deformation is reversible by a "reflow" process or by heating the C4-balls above their melting point.

Despite the fact that the above described preferred embodiment of the invention refers to wafer testing, the invention is not restricted to only wafers. In particular, the invention can also be used for testing printed circuit boards and the like, since printed circuit boards have also a large number of contacts for testing purposes.

While only a few illustrative embodiments have been described in detail, it should be apparent to those skilled in the art that there are other variations within the scope of this invention which are more particularly defined in the appended claims.

What is claimed is:

1. A method of testing a chip having a plurality of contact pads, which is tested with a test system having a test head provided with a plurality test probes, said method comprising the steps of:
    a) moving the test head and the chips towards each other by a distance which is smaller than a predefined maximum length;
    b) determining the presence of a contact between the probes and the contact pads by performing an electrical test via the probes to yield a predetermined electrical result, said result indicating the absence of electrical contact between at least one of said probes and a corresponding one of said contact pads; and
    c) repeating steps a) and b) while vibrating one of the test head and the contact pads in a plane that is substantially parallel to a plane comprising the contact pads, and while nondestructively deforming selected contact pads required to ensure that the electrical test no longer yields said predetermined electrical result, thereby indicating that electrical contact between all the test probes and their respective contact pad has been obtained.

2. The method of testing as recited in step c) of claim 1, wherein said test head is repeatedly moved by a distance of a second smaller predefined length.

3. The method of testing as recited in claim 1, wherein during said successive repetitions of steps a) and b) said second predefined length is successively decremented.

4. The method of testing as recited in claim 1, wherein said vibrating of the test head or the contact pads is carried out with a predefined amplitude, and wherein said amplitude is approximately one-half the diameter of one of said contact pads.

5. The method of testing as recited in claim 1, wherein said vibrating is responsive to an ultrasonic source, and wherein the frequency of said ultrasonic source substantially corresponds to a resonance frequency of said probes.

6. The method of testing according to claim 1, wherein the electrical test performed in step c) yields a different electrical result, said different result indicates that said chip is operable.

7. The method of testing according to claim 1, wherein in step c), moving the test head and the chips towards each other is continued until said predefined maximum length is reached, thereby indicating that the chip is defective.

8. The method of testing according to claim 1, wherein said predefined maximum length corresponds to a maximum pressure to be exerted on said probes and on said test head.

9. A method of testing according to claim 1, wherein the result of said electrical test is stored in a data processing system to indicate the presence of a defective chip.

10. A test system for testing a chip having a plurality of contact pads, comprising:
    a test head connected to vibration means, said test head is provided with a plurality of probes;
    positioning means attached to said test head for positioning said test head so that said probes respectively contact said contact pads of said chip;
    testing means connected to said test head for testing said chip; and controlling means connected to said positioning means for controlling said positioning means, wherein;

said controlling means move said test head and said chip towards each other by a distance smaller than a predefined maximum length, said vibration means vibrate one of said test head and said probes in a plane substantially parallel to a plane comprising said contact pads, said controlling means and said vibration means non-destructively deform selected contact pads, and said testing means performs an electric test yielding a predetermined electrical result, said electrical result determining the presence of electrical contact between all the test probes and their respective contact pad.

11. The test system according to claim 10, further comprising:
first positioning means for positioning said test head in a plane substantially parallel to the plane comprising the pads of said chips; and
second positioning means for moving said test head in a direction substantially perpendicular to the plane comprising the pads of said chips.

12. The method of testing according to claim 1, further comprising the step of:
d) reflowing said contact pads upon completing testing the chip to return said pads to their original shape.

13. The method of testing according to claim 1, further comprising the step of:
d) heating said contact pads above their melting point upon completing testing the chip to return said pads to their original shape.

* * * * *